United States Patent
Ueyanagi et al.

(10) Patent No.: US 6,962,081 B2
(45) Date of Patent: Nov. 8, 2005

(54) SEMICONDUCTOR PHYSICAL QUANTITY SENSOR WITH IMPROVED NOISE RESISTANCE

(75) Inventors: Katsumichi Ueyanagi, Nagano (JP); Kazunori Saito, Nagano (JP); Kimihiro Ashino, Nagano (JP); Mutsuo Nishikawa, Nagano (JP); Katsuyuki Uematsu, Nagano (JP)

(73) Assignee: Fuji Electric Co., Ltd. (JP)

( * ) Notice: Subject to any disclaimer, the term of this patent is extended or adjusted under 35 U.S.C. 154(b) by 358 days.

(21) Appl. No.: 10/053,528

(22) Filed: Jan. 18, 2002

(65) Prior Publication Data
US 2002/0144554 A1 Oct. 10, 2002

(30) Foreign Application Priority Data
Jan. 18, 2001 (JP) ....................... 2001-010772

(51) Int. Cl.$^7$ ............................................. G01P 15/00
(52) U.S. Cl. ................................................... 73/514.18
(58) Field of Search ..................... 73/517 A, 517 AV, 73/504, 505, 517 B, 1.01, 514.18; 348/229, 230, 300–308; 303/100, 105; 368/200, 46–56

(56) References Cited

U.S. PATENT DOCUMENTS

| | | | | |
|---|---|---|---|---|
| 4,282,595 A | * | 8/1981 | Lowdenslager et al. | .... 368/200 |
| 4,413,527 A | | 11/1983 | Sugiura et al. | ................ 73/754 |
| 5,365,768 A | * | 11/1994 | Suzuki et al. | ................ 73/1.01 |
| 5,392,650 A | * | 2/1995 | O'Brien et al. | .......... 73/514.18 |
| 5,417,312 A | * | 5/1995 | Tsuchitani et al. | ...... 188/181 A |
| 5,781,233 A | * | 7/1998 | Liang et al. | ................ 348/302 |
| 5,864,062 A | | 1/1999 | Nagahara et al. | ........ 73/514.01 |
| 6,239,732 B1 | | 5/2001 | Cusey | ........................ 341/155 |

FOREIGN PATENT DOCUMENTS

| | | |
|---|---|---|
| JP | 64039565 A | 2/1989 |
| JP | 01094646 A | 4/1989 |
| JP | 010220467 A | 9/1989 |
| JP | 10096743 A | 4/1998 |
| JP | 11194061 A | 7/1999 |
| JP | 2001130002 A | 5/2001 |

* cited by examiner

*Primary Examiner*—William Oen
(74) *Attorney, Agent, or Firm*—Rossi & Associates

(57) ABSTRACT

An inexpensive, accurate, and reliable semiconductor physical quantity sensor having improved resistance to noise is provided, wherein pads that have been pulled down to ground inside a semiconductor chip are arranged closer to a ground pad, while pads and that have been pulled up to a power supply inside the chip are arranged closer to a power supply pad. Of the digital input/output pads that have undergone digital trimming to obtain a predetermined output, the pulled-down pads and the ground pad are electrically connected to a ground terminal outside the chip via internal exposed portions, wires, and a ground-connecting external wire. The pulled-up pads and the power supply pad are electrically connected to a power supply terminal outside the chip via the internal exposed portions, the wires, and a power-supply-connecting external wire. Terminals may be electrically connected together on a package or a mounting substrate.

13 Claims, 7 Drawing Sheets

SEMICONDUCTOR PHYSICAL QUANTITY SENSOR WITH IMPROVED NOISE RESISTANCE

FIELD OF THE INVENTION

The present invention relates to a semiconductor physical quantity sensor, such as a pressure sensor or an acceleration sensor, that is used for automobiles, medical or industrial applications.

BACKGROUND

The increasing number, density, and power of various advanced control systems within vehicles, and of electric or electromagnetic radiation associated with the communications needs of the advanced information-oriented society, has led to increasing electrical noise in the environment. Pressure, acceleration, and other sensors are mostly configured to amplify fine signals and are thus likely to be affected by this noise. Accordingly, there has been great a demand for improvements in the noise resistance of electronic components for use in automobiles, medical devices and other industrial sensors.

Specific defects in sensors caused by noise include destruction of elements associated with static electricity or overvoltage and malfunctioning of sensor signals induced by radiating or propagating noise. Measures are required to prevent these defects.

For example, as shown in FIG. 7, conventional pressure sensors are structured to prevent radiating and propagating noise. In such pressure sensors, a metal-can-shaped metal cap 64 blocks potential external radiating noise to prevent a pressure sensor chip 61 mounted on a glass pedestal 62 from being affected thereby. Further, a penetrating capacitor 66 of about 1 to 10 nF or the like is mounted in terminal portions (a pressure introducing pipe 63 and a metal stem 65) to remove propagating noise therefrom. With a conventional structure consisting of such a can type package, however, the metal cap 64 and the penetrating capacitor 66 increase the expense of the sensor.

Further, in a conventional pressure sensor consisting of a resin type package as shown in FIG. 8, a metal plate 74 is embedded in an outer case of a resin to protect a pressure sensor chip 71 on a glass pedestal 72 from radiating noise, or a penetrating capacitor is mounted on an external substrate 75 to remove propagating noise from a terminal (socket 76). Even in such conventional case configurations, however, the provision of the additional parts, that is, the metal plate 74 and the penetrating capacitor, increases the expense of the sensor.

Still further, a pressure sensor circuit constructed using a CMOS process requires multiple digital-regulating terminals. In most cases, these terminals are connected to an external device by wire bonding, and thus act as paths through which extraneous noise may enter the sensor, thereby degrading noise resistance capability.

It would therefore be desirable to provide a semiconductor physical quantity sensor that can, at relatively modest expense, provide significantly improved resistance to extraneous noise.

SUMMARY OF THE INVENTION

The present invention provides a semiconductor physical quantity sensor that converts digital data into analog data for digital trimming in response to a signal from a sensor circuit indicating that an analog quantity has been detected, the semiconductor physical quantity sensor characterized in that, of digital input/output pads that have undergone digital trimming in order to obtain a predetermined output, pads that have been pulled down to a ground inside a semiconductor chip, and a ground pad are electrically connected to a ground terminal outside the semiconductor chip and pads that have been pulled up to a power supply inside a semiconductor chip and a power supply pad are electrically connected to a power supply terminal outside the semiconductor chip.

Further, the semiconductor physical quantity sensor of the present invention is characterized in that with respect to the digital input/output pads that have undergone digital trimming in order to obtain a predetermined output, the connections between the pads that have been pulled down inside the semiconductor chip and the ground terminal as well as the connections between the pads that have been pulled up inside the semiconductor chip and the power supply terminal are each established by electrically connecting the terminals together on a package.

Furthermore, the semiconductor physical quantity sensor of the present invention is characterized in that with respect to the digital input/output pads that have undergone digital trimming in order to obtain a predetermined output, the connections between the pads that have been pulled down inside the semiconductor chip and the ground terminal as well as the connections between the pads that have been pulled up inside the semiconductor chip and the power supply terminal are each established by an electric connection on a mounting substrate.

Moreover, the semiconductor physical quantity sensor of the present invention is characterized in that as a layout on the semiconductor chip, of the digital input/output pads, the pads that have been pulled down inside the semiconductor chip are arranged closer to the ground pad, and the pads that have been pulled up inside the semiconductor chip are arranged closer to the power supply pad.

In this case, the semiconductor physical quantity sensor is characterized in that said semiconductor physical quantity sensor is a pressure or an acceleration sensor of a semiconductor strain gauge type.

The present invention provides a semiconductor physical quantity sensor characterized in that a semiconductor chip is placed on either a resin case or a substrate via a pedestal, and both first pads in the semiconductor chip which are to be pulled down and a ground pad are electrically connected to the ground outside the semiconductor chip.

In this case, second pads in the semiconductor chip which are to be pulled up and a power supply pad are electrically connected to a power supply outside the semiconductor chip.

The present invention provides a semiconductor physical quantity sensor characterized in that a semiconductor chip is placed on either a resin case or a substrate via a pedestal, and both second pads in the semiconductor chip which are to be pulled up and a power supply pad are electrically connected to a power supply outside the semiconductor chip.

The present invention provides a semiconductor physical quantity sensor characterized in that a semiconductor chip is placed on a resin case via a pedestal, the resin case in which lead frames are insert-molded, in that within the resin case are formed both a ground-connecting external wire through which a ground pad of the semiconductor chip and first pads to be pulled down are electrically connected and an power-supply-connecting external wires through which a power supply pad of the semiconductor chip and second pads to be pulled up are electrically connected, and in that the ground-connecting external wire is connected to a ground lead frame, whereas the power-supply-connecting external wire is connected to a power supply lead frame.

In this case, the ground-connecting external wire and the power-supply-connecting external wire are each connected to the corresponding lead frames outside the resin case.

Further, the ground-connecting external wire and the ground lead frame are integrated, as are the power-supply-connecting external wire and the power supply lead frame.

The present invention provides a semiconductor physical quantity sensor characterized in that a conductor pattern for ground connections, a conductor pattern for power supply connections, and an output conductor pattern are formed on a substrate, in that lead frames corresponding to a ground pad of a semiconductor chip placed on a resin case and first pads thereof which are to be pulled down are connected to the conductor pattern for ground connections, and in that lead frames corresponding to a power supply pad of the semiconductor chip and second pads thereof which are to be pulled up are electrically connected to the conductor pattern for power supply connections, and an output lead frame corresponding to an output pad of the semiconductor chip is electrically connected to the output conductor pattern.

According to the present invention, the above configuration improves the noise resistance of a semiconductor physical quantity sensor that converts digital data into analog data for digital trimming in response to a signal from a sensor circuit indicating that an analog quantity has been detected. Further, according to the present invention, a semiconductor physical quantity sensor having high noise resistance can be implemented on a package. Furthermore, according to the present invention, a semiconductor physical quantity sensor having high noise resistance can be implemented on a mounting substrate. Moreover, according to the present invention, a semiconductor physical quantity sensor having high noise resistance can be easily implemented.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Figure 1:
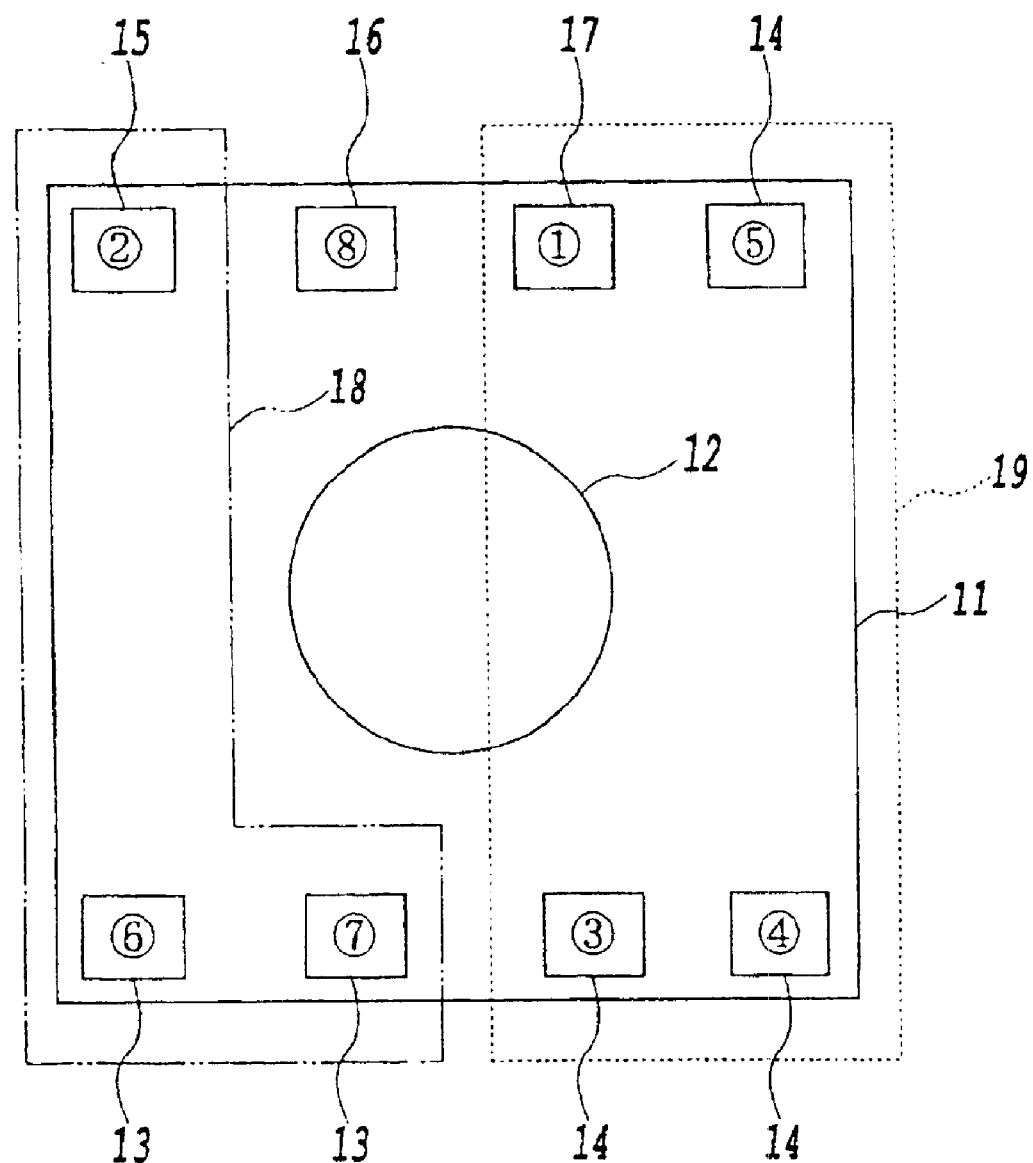
FIG. 1 is a top view showing an arrangement of pads of a semiconductor sensor chip for use in each embodiment of the present invention.

FIG. 1 shows a configuration of a semiconductor sensor chip used for a semiconductor physical quantity sensor used in each of the embodiments of the present invention described later. In FIG. 1, a semiconductor chip 11 has a sensor section 12 (that has, for example, a strain gauge formed on a pressure detecting diaphragm (not shown)), a processing circuit processing outputs from the strain gauge, and pads 13 to 17, all of which are formed on the chip.

The pads 13 to 17 include a digital trimming pad 13 of a power supply pull-up type, a digital trimming pad 14 of a power supply pull-down type, a power supply pad (Vcc) 15, a sensor output signal pad (Vout) 16, and a ground pad (GND) 17. Like semiconductor sensor chip 11, the pads are divided into two groups: a group 18 of pads (pads 13 and 15) connected to a power supply outside the semiconductor sensor chip 11 and a group 19 of pads (pads 14 and 17) connected to a ground outside the semiconductor sensor chip In the semiconductor sensor chip 11, the digital trimming pad 13 of a power supply pull-up type is pulled up to the power supply (normally high). Further, the digital trimming pad 14 of a power pull-down type is pulled down to the ground (normally low). In the semiconductor sensor chip 11, the digital trimming pad 13 of a power supply pull-up type and the digital trimming pad 14 of a power supply pull-down type are thus electrically connected to a power supply voltage and to a ground potential, respectively. Then, these potentials are fixed to improve the noise resistance capability.

In the semiconductor sensor chip 11, the digital trimming pad 13 of a power supply pull-up type is arranged closer to the power supply pad 15. This pad arrangement facilitates the digital trimming pad 13 of a power supply pull-up type to be electrically connected to the power supply together with the power supply pad 15 using a power-supply-connecting external wire (not shown) located outside the semiconductor chip 11.

Further, in the semiconductor sensor chip 11, the digital trimming pad 14 of a power supply pull-down type is arranged closer to the ground pad 17. Such a pad arrangement facilitates the electrical connection of the digital trimming pad 14 of a power supply pull-down type to the ground (GND), together with the ground pad 17 using a ground-connecting external wire (not shown) located outside the semiconductor chip 11.

The above pad arrangement facilitates electric connections outside semiconductor sensor chip 11, thereby simplifying sheathing parts to reduce costs, while avoiding a complicated sheathing process. Further, the pad groups 18 and 19 are each connected to the power-supply-connecting and ground-connecting external wires, respectively, thereby improving noise resistance capabilities.

The numbers enclosed by circles in FIG. 1 are added to allow easy grasp of correspondence to other figures. Reference numeral 1 denotes the ground pad (GND), 2 is the power supply pad (Vcc), 3, 4, and 5 are the digital trimming pads of a power supply pull-down type, 6 and 7 are the digital trimming pads of a power supply pull-up type, and 8 is the sensor signal outputting pad (Vout).

Figure 2:
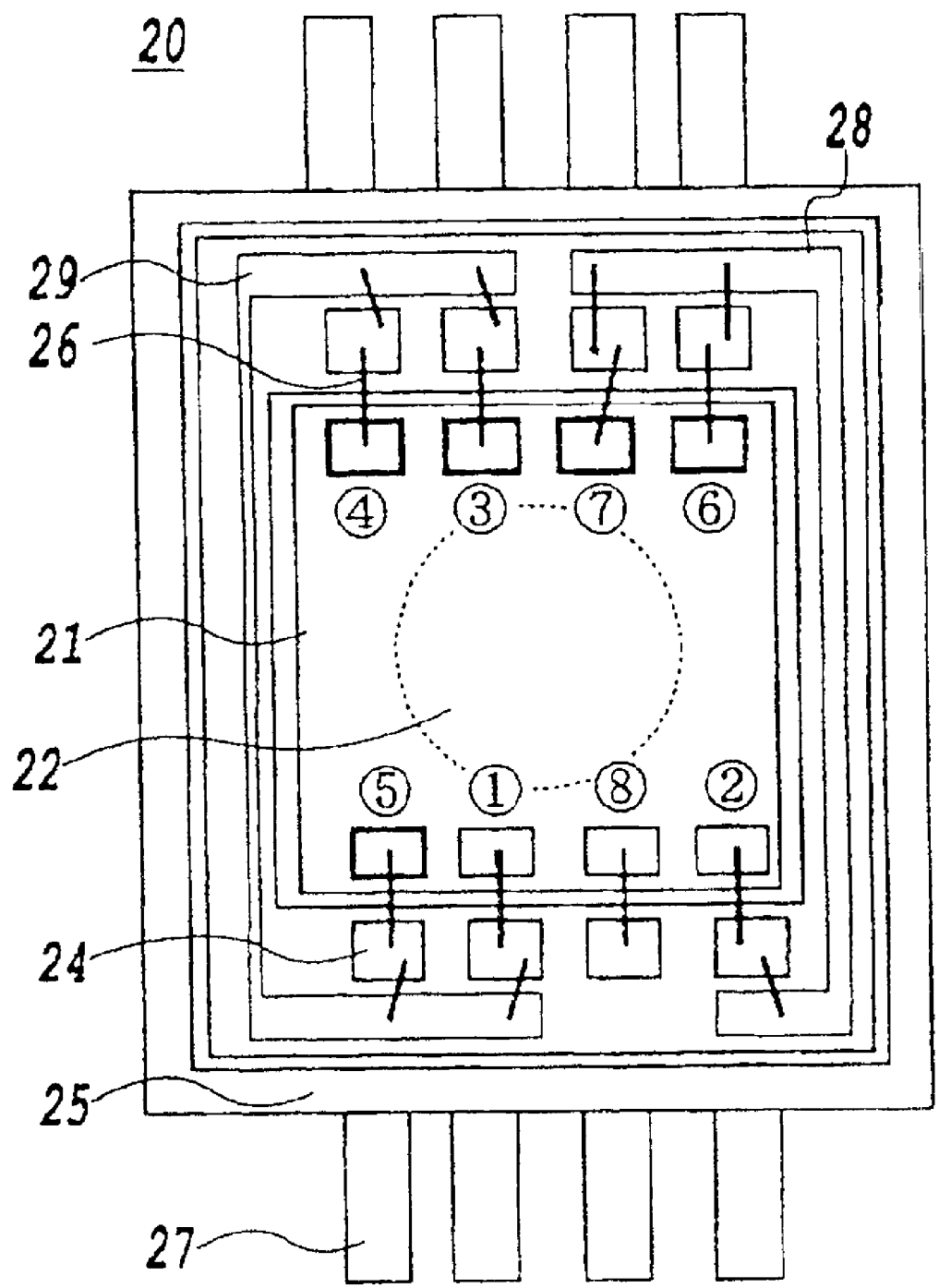
FIG. 2 is a top view showing a configuration of a semiconductor physical quantity sensor according to a first embodiment of the present invention.

FIG. 2 shows a configuration of a semiconductor physical quantity sensor 20 according to a first embodiment of the present invention. A semiconductor sensor chip 21 in FIG. 2 is equivalent to the semiconductor sensor chip 11, shown in FIG. 1. In this example, a resin case 25 having the semiconductor sensor chip 21 accommodated therein is provided with a ground-connecting external wire 29 and a power-supply-connecting external wire 28. Using these connecting external wires 28 and 29, portions to be pulled down and up are connected to the ground-connecting conductor 29 and the power-supply-connecting conductor 28, respectively.

The resin case 25 has eight lead frames 27: that is, four on each side thereof (the lead frames are denoted by 27-1 to 27-8; the one corresponding to the "ground-connecting pad 1" is denoted by "27-1") and the ground-connecting and power-supply-connecting external wires 29 and 28, each of which is insert-molded therein. Reference numeral 24 denotes a portion of the lead frame 27 that penetrates the resin case 25 and is exposed to the interior thereof (this portion will be hereafter referred to as an "internal exposed portion 24" and for example, the one corresponding to the "ground pad 1" is denoted by "24-1".

The power-supply-connecting external wire 28 is arranged close to those of the pads formed within the resin case 25 and on the semiconductor sensor chip 21 which are connected to the power supply, that is, the pads 2, 6, and 7.

The ground-connecting external wire 29 is arranged close to those of the pads formed within the resin case 25 and on the semiconductor sensor chip 21, which are connected to the ground, that is, the pads 1, 3, 4, and 5.

Part of each of the connecting external wires 28 and 29—for example, the opposite ends thereof—are molded in the resin case 25 and insulated from the lead frames 27.

An accommodating section of the resin case 25 has a glass pedestal (not shown) bonded thereto using an adhesive—for example, an epoxy—or a silicone-based one—on which the semiconductor sensor chip 21 is placed. The pads of the semiconductor sensor chip 21 are wire-bonded and electrically connected to the internal exposed portions 24 of the corresponding lead frames using, for example, aluminum wires 26.

The internal exposed portions 24-3, 24-4, and 24-5, corresponding to the ground pad 1 of the semiconductor sensor chip 21 and the digital trimming pads 3, 4, and 5 of a power supply pull-down type which are to be pulled down to the ground, are wire-bonded and electrically connected to the ground-connecting external wire 29 using aluminum wires 26.

The internal exposed portions 24-2, 24-6, and 24-7, corresponding to the power supply pad 2 of the semiconductor sensor chip 21 and the digital trimming pads 6 and 7 of a power supply pull-up type which are to be pulled up to the power supply are wire-bonded and electrically connected to the power-supply-connecting external wire 28 using aluminum wires 26. Sensor outputs are obtained from the lead frame 27-8, corresponding to the sensor output signal pad 8.

The ground-connecting external wire 29, the power-supply-connecting external wire 28, and the lead frame 27 are composed of materials such as bronze phosphorous, 42 alloy, or iron-nickel.

The resin case 25 is formed of materials such as an epoxy resin or PPS (polyphenylene sulfide). These resins serves to reduce the thermal stress placed on the semiconductor sensor chip 21.

An operation of the semiconductor physical quantity sensor 20 comprises applying a power supply voltage between the power supply lead frame 27-2 and the ground lead frame 27-1, converting (for example) a pressure detected by a sensor section 22 of the semiconductor sensor chip 21 into an electric signal, and processing this signal in the processing circuit to output the processed signal from the pad 8 via the lead frame 27-8.

The adjustment of outputs from the semiconductor physical quantity sensor 20 is now described. The (eight) pads of the semiconductor sensor chip 21 are wire-bonded and electrically connected to the corresponding internal exposed portions 24. To obtain a predetermined output from the semiconductor physical quantity sensor, adjustment quantities are written, through the digital trimming lead frames 27-3 to 27-7, to an EPROM or the like, which is built into the semiconductor sensor chip 21 for electrical adjustment. Following this adjustment, to fix the digital trimming pads 6 and 7 of a power supply pull-up type at the power supply potential outside the semiconductor sensor chip 21, the internal exposed portions 24-6 and 24-7 are wire-bonded to the power-supply-connecting external wire 28. Further, to fix the digital trimming pads 3, 4, and 5 of a power supply pull-down type at the potential outside the semiconductor sensor chip 21, the internal exposed portions 24-3, 24-4, and 24-5 are wire-bonded to the ground-connecting external wire 29.

In this configuration, the potential of the digital trimming pads is fixed at the power supply potential or the ground potential outside the semiconductor sensor chip 21. Accordingly, even if the sensor is subjected to noise, the potential of the pads is constrained from varying, thereby preventing the semiconductor physical quantity sensor 20 from malfunctioning.

Furthermore, the ground-connecting external wire 29 can be integrated with the ground lead frame 27-1, while the power-supply-connecting external wire 28 can be integrated with the power supply lead frame 27-2. Such integration also prevents malfunctions.

Figure 3A:
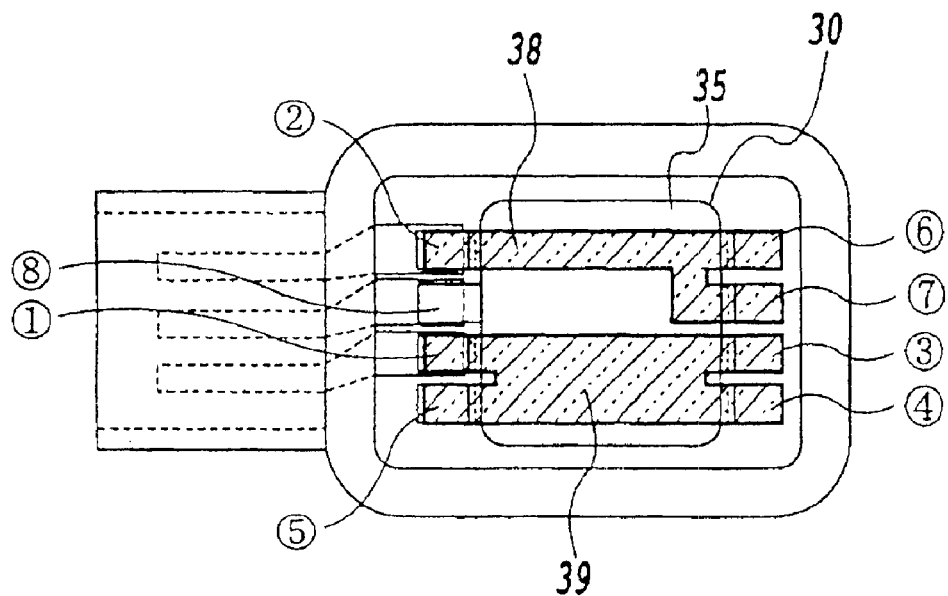
FIGS. 3(A) and 3(B) are a top view and a sectional view showing a configuration of a semiconductor physical quantity sensor according to a second embodiment of the present invention.
Figure 3B:
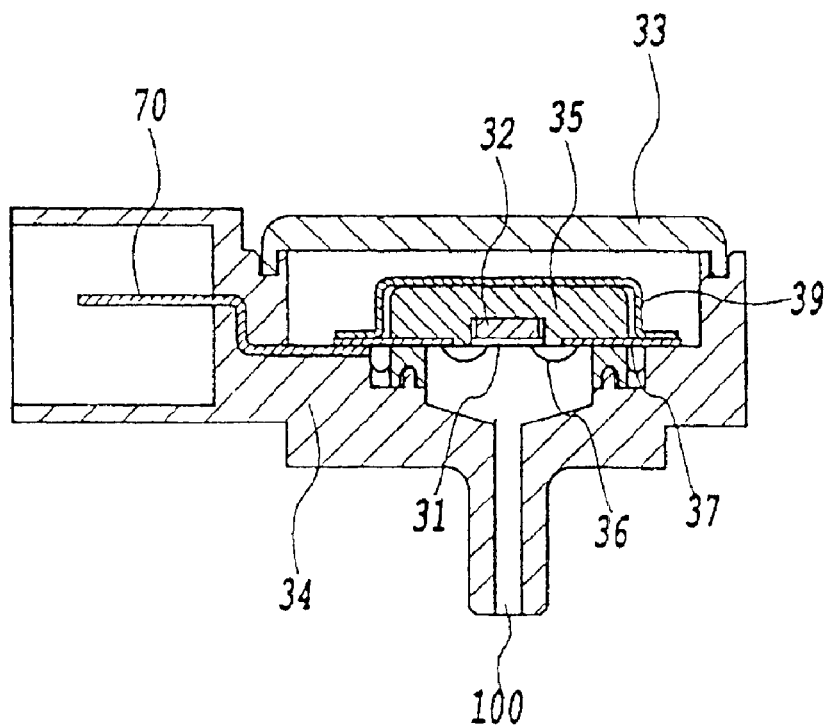

FIG. 3 shows a configuration in which a semiconductor physical quantity sensor 30 according to a second embodiment of the present invention is accommodated in a sheathing resin case.

The semiconductor physical quantity sensor 30 corresponds to the semiconductor physical quantity sensor 20 shown in FIG. 2, which has the power-supply-connecting and ground-connecting external wires 28 and 29 disposed outside the resin case 25 rather than inside it (this is an example in which dimensional or assembly restrictions hinder the power-supply-connecting and ground-connecting external wires 28 and 29 from being incorporated into the resin case 25).

That is, in FIG. 3, the semiconductor physical quantity sensor 30 comprises a resin case 35 having eight lead frames 37, that is, four on each side thereof (the lead frames are denoted by 37-1 to 37-8; the one corresponding to the "ground pad 1" is denoted by "37-1"), a semiconductor sensor chip 31 accommodated in an accommodating section of the case 35 via a glass pedestal 32, wires 36 each connecting a pad of the semiconductor sensor chip 31 to an internal exposed portion of a corresponding lead frame 37, a power-supply-connecting external wire 38 connecting to lead frames 37-1, 37-3, and 37-4 outside the resin case 35, and a ground-connecting external wire 39 connecting to lead frames 37-1, 37-3, 37-4, and 37-5 outside the resin case 35.

The power-supply-connecting and ground-connecting external wires 38 and 39 are disposed outside the resin case 35 and formed along a surface of the resin case 35 opposite the surface thereof on which the semiconductor sensor chip 31 is mounted. The connecting external wires 38 and 39 may or may not be in contact with the resin case 35.

The adjustment of outputs from the semiconductor physical quantity sensor 30 is now described. The pads of the semiconductor sensor chip 31 are wire-bonded and electrically connected to the internal exposed portions of the corresponding lead frames 37. To obtain a predetermined output from the semiconductor physical quantity sensor, adjustment quantities are written, through the digital trimming lead frames 37-3 to 37-7, to an EPROM or the like, which is built into the semiconductor sensor chip for electrical adjustment. After this adjustment, to fix the digital trimming pads 6 and 7 of a power supply pull-up type at the power supply potential outside the resin case 35, the power-supply-connecting external wire 38 is electrically connected to the lead frames 37-2,37-6, and 37-7. Further, to fix the digital trimming pads 3, 4, and 5 of a power supply pull-down type at the ground potential outside the resin case 35, the ground-connecting external wire 39 is electrically connected to the lead frames 37-1, 37-3, 37-4, and 37-5.

In FIG. 3, the sensor comprises a sheathing resin case 34 having a connector terminal 70 (composed of a power supply terminal, a ground terminal, and an output terminal) insert-molded therein, an accommodating section for the resin case, and in this case an introduction hole 100 through which pressure is introduced. The sheathing resin case 34 is formed of (for example) a nylon-based resin or PBT (polybutylene telephthalete). Further, the connector terminal 70 is formed of bronze phosphorous, 42 alloy, or iron-nickel.

The resin case 35 is bonded to the accommodating section of the sheathing resin case 34 using an adhesive, (for example), one based on silicone or epoxy. The semiconductor sensor chip 31 in the resin case 35 is positioned opposite the introduction hole 100.

Of the lead frames 37 of the resin case 35, the one 37-1 wire-bonded and connected to the ground pad 1 of the semiconductor sensor chip 31 is connected to the power supply terminal of the connector terminal 70. Likewise, the lead frame 37-2 connected to the power supply pad 2 is connected to the ground terminal of the connector terminal 70, and the lead frame 37-8 connected to the sensor signal outputting pad 8 is connected to the output terminal of the connector terminal 70.

A sheathing resin cover 33 is bonded to the sheathing resin case 34 using an adhesive, (for example), one based on silicone or epoxy.

In the connector terminal 70, connected portions of the power supply terminal and ground terminal are each composed of three layers including the terminal 70, the lead frame 37, and the connecting external wire 38 (or 39), whereas a connected portion of the output terminal therein is composed of the output terminal and the lead frame 37. The other connected portions are each composed of the lead frame 37 and the connecting external wire 38 (or 39). These connected portions are connected by soldering or welding.

In this configuration, the potential of the digital trimming pads is fixed at the power supply potential or ground potential outside the semiconductor sensor chip 31 (also outside the resin case 35). Consequently, even if the sensor is subjected to noise, the potential of the pads is constrained from varying, thereby preventing the semiconductor physical quantity sensor 30 from malfunctioning.

Figure 4A:
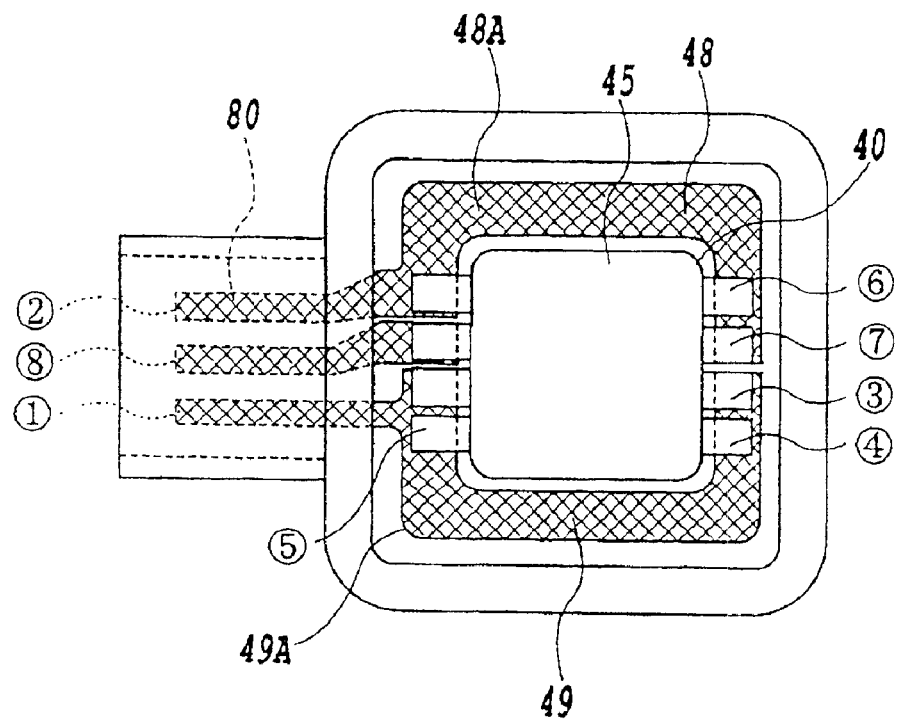
FIGS. 4(A) and 4(B) are a top view and a sectional view, respectively, showing a configuration of a semiconductor physical quantity sensor according to a third embodiment of the present invention.
Figure 4B:
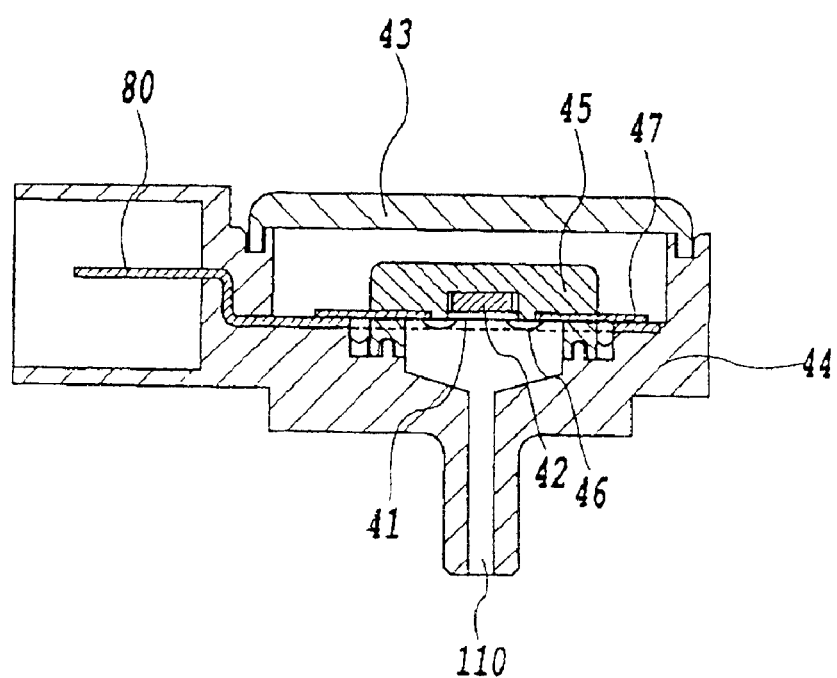

FIG. 4 shows a configuration in which a semiconductor physical quantity sensor 40 according to a third embodiment of the present invention is accommodated in a sheathing resin case.

The semiconductor physical quantity sensor 40 in FIG. 4 is similar to the semiconductor physical quantity sensor 30 shown in FIG. 3. That is, in FIG. 4, the semiconductor physical quantity sensor 40 comprises a resin case 45 having eight lead frames 37, that is, four on each side thereof (the lead frames are denoted by 47-1 to 47-8; the one corresponding to the "ground pad 1" is denoted by "47-1"), a semiconductor sensor chip 41 accommodated in an accommodating section of the case 45 via a glass pedestal 42, aluminum wires 46 each connecting a pad of the semiconductor sensor chip 41 to an internal exposed portion of a corresponding lead frame 47, a power-supply-connecting external wire 48 electrically connecting to lead frames 47-2, 47-6, and 47-7 outside the resin case 45, and a ground-connecting external wire 49 electrically connecting to lead frames 47-1, 47-3, 47-4, and 47-5 outside the resin case 45.

The power-supply-connecting and ground-connecting external wires 48 and 49 are disposed outside the resin case 45 and in this case are formed in a sheathing resin case 44.

The adjustment of outputs from the semiconductor physical quantity sensor 40 is now described. The pads of the semiconductor sensor chip 41 are wire-bonded and electrically connected to the internal exposed portions of the corresponding lead frames 47. To obtain a predetermined output from the semiconductor physical quantity sensor, adjustment quantities are written, through the digital trimming lead frames 47-3 to 47-7, to an EPROM or the like, which is built into the semiconductor sensor chip 41 for electrical adjustment. After this adjustment, to fix the digital trimming pads 6 and 7 of a power supply pull-up type at the power supply potential outside the resin case 45, the power-supply-connecting external wire 48 is electrically connected to the lead frames 47-2, 47-6, and 47-7. Further, to fix the digital trimming pads 3, 4, and 5 of a power supply pull-down type at the ground potential outside the resin case 45, the ground-connecting external wire 49 is electrically connected to the lead frames 47-1, 47-3, 47-4, and 47-7.

With reference to FIG. 4, the configuration in which the semiconductor physical quantity sensor 40 is accommodated in the sheathing resin case 44 is now described. The sheathing resin case 44 has a power-supply-connecting conductor 48A formed by integrating a power supply terminal of a connector terminal 80 and the power-supply-connecting external wire 48, a ground-connecting conductor 49A formed by integrating a ground terminal of the connector terminal 80 and the ground-connecting external wire 49, and an output terminal of the connector terminal 80, each of which is insert-molded in the case. Furthermore, as in the case illustrated in FIG. 3, the sheathing resin case 44 is provided with an accommodating section for the resin case and an introduction hole 110 through which pressure is introduced. Further, the connecting conductors 48A and 49A are formed of materials such as bronze phosphorous, 42 alloy, or iron-nickel.

The resin case 45 is bonded to the accommodating section of the sheathing resin case 44 using an adhesive, (for example), one based on silicone or epoxy. The semiconductor sensor chip 41 in the resin case 45 is positioned opposite the introduction hole 110.

A sheathing resin cover 43 is bonded to the sheathing resin case 44 using an adhesive, (for example), one based on silicone or epoxy.

Of the lead frames 47 of the resin case 45, the lead frames 47-2, 47-6, and 47-7 are connected to the power-supply-connecting external conductor 48A. Likewise, the lead frames 47-1, 47-3, 47-4, and 47-5 are connected to the ground-connecting conductor 49A, while the lead frame 47-8 is connected to the output terminal. These connected portions are each composed of two layers including the connecting external conductor 48A (or 49A) and the lead frame 47, which are connected by soldering or welding.

In this configuration, the potential of the digital trimming pads is fixed at the power supply potential or ground potential outside the semiconductor sensor chip 41 (also outside the resin case 45). Consequently, even if the sensor is subjected to noise, the potential of the pads is constrained from varying, thereby preventing the semiconductor physical quantity sensor 40 from malfunctioning.

Figure 5:
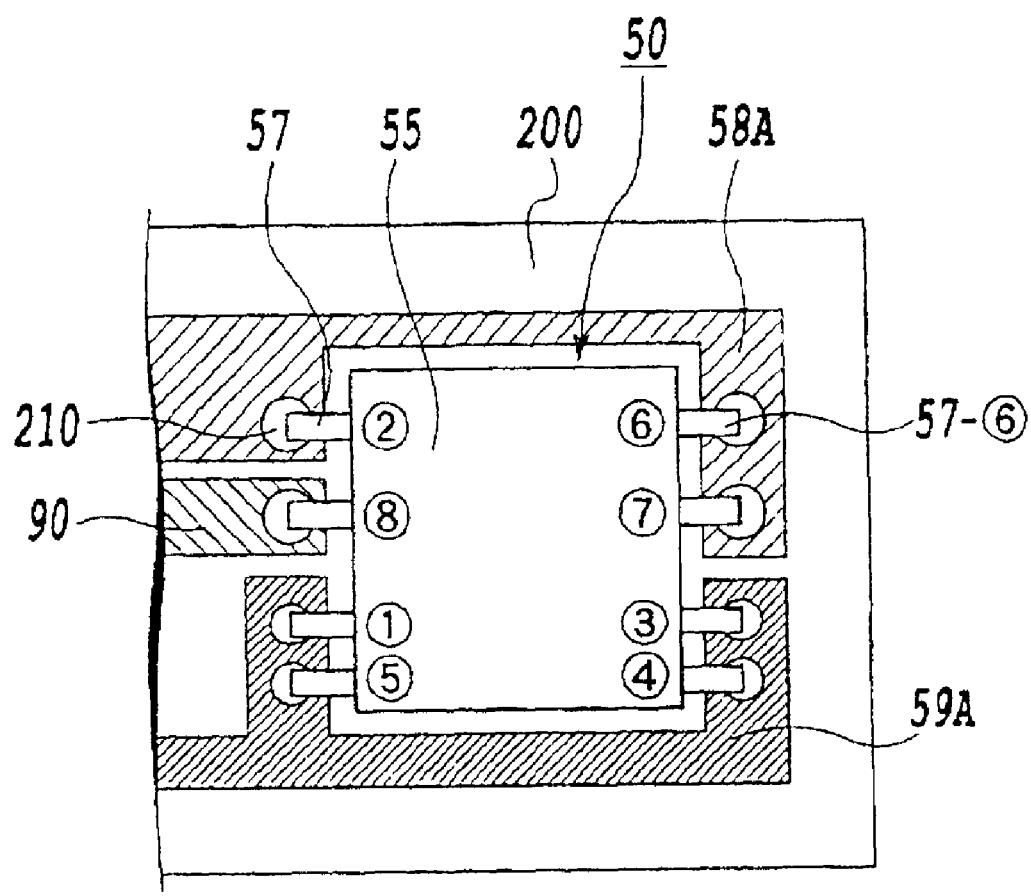
FIG. 5 is a top view showing a configuration of a semiconductor physical quantity sensor according to a fourth embodiment of the present invention.

FIG. 5 shows a configuration in which a semiconductor physical quantity sensor 50 according to a fourth embodiment of the present invention is mounted on a substrate.

The semiconductor physical quantity sensor 50 in FIG. 5 is similar to the semiconductor physical quantity sensor 30 shown in FIG. 3. That is, in FIG. 5 (a semiconductor sensor chip 51, wires 56, or internal exposed portions of lead frames 57 in a resin case 55 are not illustrated), the semiconductor physical quantity sensor 50 comprises a resin case 55 having eight lead frames 57, that is, four on each side thereof (the lead frames are denoted by 57-1 to 57-8; the one corresponding to the "ground pad 1" is denoted by "57-1"), the semiconductor sensor chip 51 accommodated in an accommodating section of the case 55 via a glass pedestal, the aluminum wires 56 each connecting a pad of the semiconductor sensor chip 51 to the internal exposed portion of the corresponding lead frame 57, a power-supply-connecting conductor 58A connecting to lead frames 57-2, 57-6, and 57-7 outside the resin case 55, and a ground-connecting conductor 59A connecting to lead frames 57-1, 57-3, 57-4, and 57-5 outside the resin case 55.

The power-supply-connecting and ground-connecting conductors 58A and 59A are disposed outside the resin case 55, and in this case formed on a substrate 200.

In FIG. 5, a substrate 200 (for example, a glass epoxy resin substrate, a ceramic substrate, or the like) has a power-supply-connecting conductor 58A comprising a power supply and a power-supply-connecting external wire integrated, a ground-connecting conductor 59A comprising a ground and a ground-connecting external wire integrated, and a sensor output conductor 90, the conductors being formed on the substrate in different predetermined patterns. The power-supply-connecting external conductor 58A, ground-connecting external conductor 59A, and sensor output conductor 90 on the substrate 200 have through-holes 210 formed at locations corresponding to the respective lead frames 57 of the resin case 55. The lead frames 57 of the resin case 55 are folded, inserted into the corresponding through-holes 210 formed in the substrate 200, and then soldered.

The adjustment of outputs from the semiconductor physical quantity sensor 50 is now described. The pads of the semiconductor sensor chip 51 are wire-bonded and electrically connected to the internal exposed portions of the corresponding lead frames 57. To obtain a predetermined output from the semiconductor physical quantity sensor 50, adjustment quantities are written, through the digital trimming lead frames 57-3 to 57-7, to an EPROM or the like, which is built into the semiconductor sensor chip 51 for electrical adjustment. After this adjustment, to fix the digital trimming pads 6 and 7 of a power supply pull-up type at the power supply potential outside the resin case 55, the lead frames 57-2, 57-6, and 57-7 are electrically connected to the power-supply-connecting external wire 58A, formed on the substrate 200. Further, to fix the digital trimming pads 3, 4, and 5 of a power supply pull-down type at the ground potential outside the resin case 55, the lead frames 57-1, 57-3, 57-4, and 57-5 are electrically connected to the ground-connecting external wire 59A, formed on the substrate 200.

In this configuration, the potential of the digital trimming pads is fixed at the power supply potential or ground potential outside the semiconductor sensor chip 51 (also outside the resin case 55). Consequently, even if the sensor is subjected to noise, the potential of the pads is constrained from varying, thereby preventing the semiconductor physical quantity sensor 50 from malfunctioning.

In this example, the substrate 200 has the through-holes 210 formed therein, but the lead frames 57 may be electrically connected to the power-supply-connecting external wire 58A, ground-connecting external wire 59A, and sensor output conductor 90 without any through-holes 210 by folding the ends of the lead frames 57.

Figure 6A:
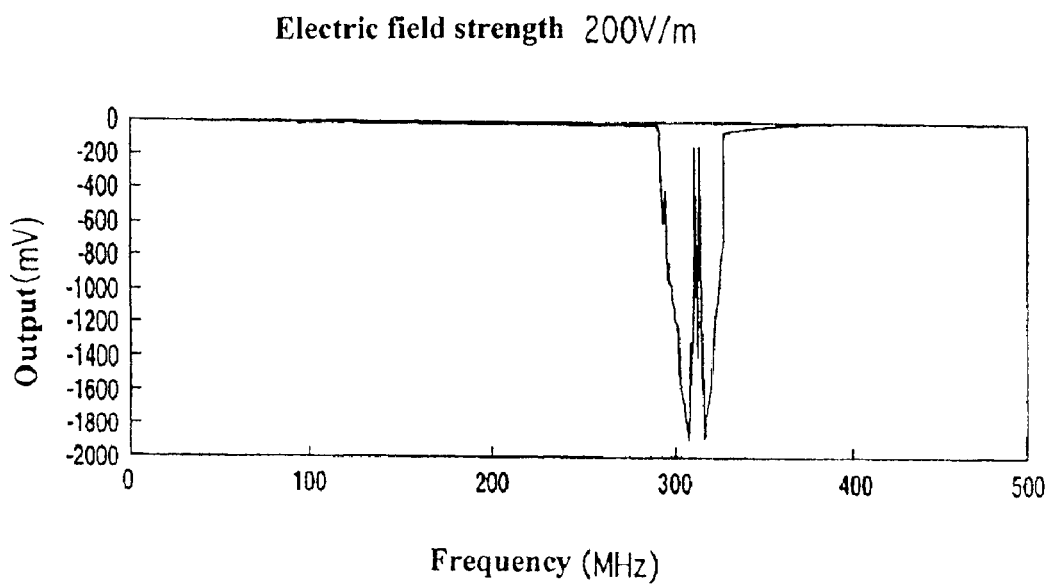
FIGS. 6(A) and 6(B) are graphs showing the results of a test (electric field strength: 200 V/m) obtained before the present invention is implemented and the results of a test (electric field strength: 200 V/m) obtained after the present invention is implemented, respectively.
Figure 6B:
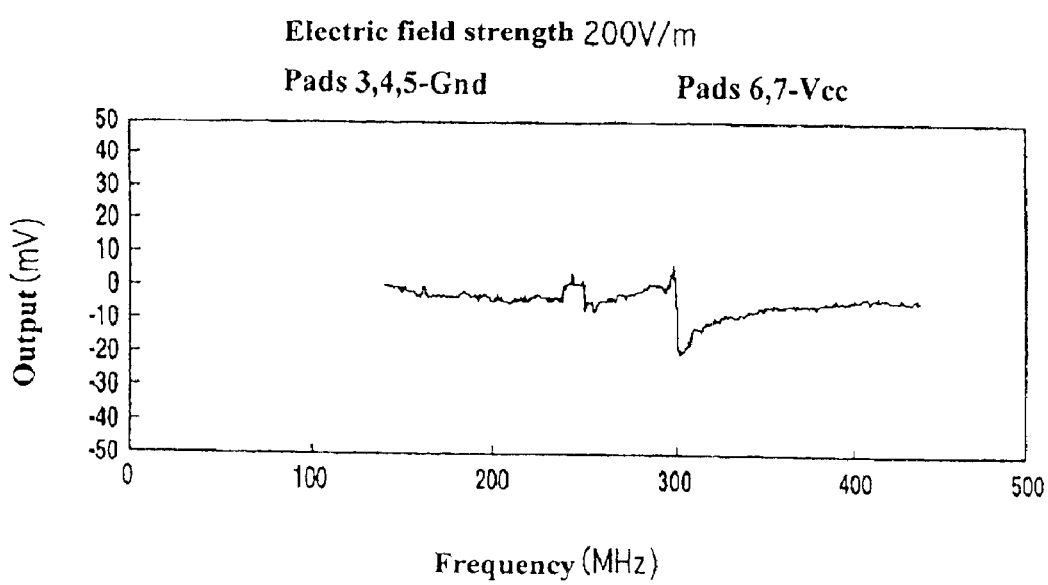
Figure 7:
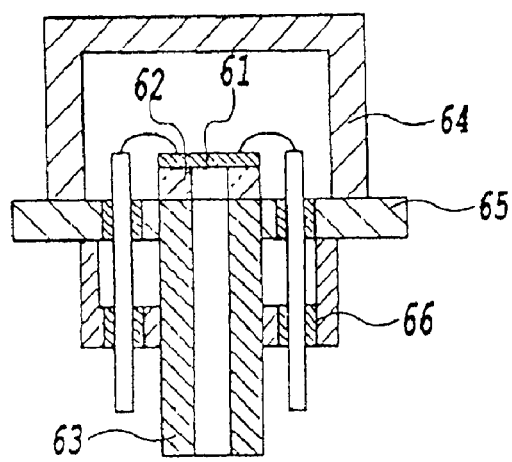
FIG. 7 is a sectional view showing an example of a conventional pressure sensor.
Figure 8:
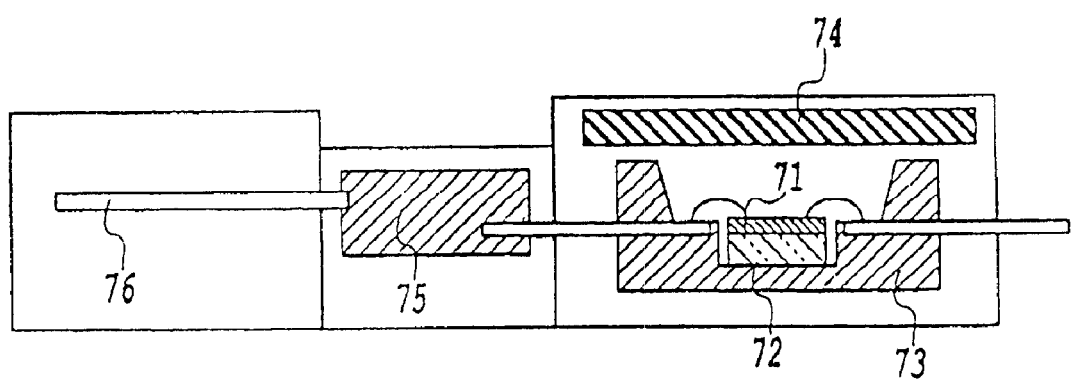
FIG. 8 is a sectional view showing another example of a conventional pressure sensor.

FIG. 6(A) shows the results of an EMI test on a conventional pressure sensor using an electric field strength of 200 V/m. FIG. 6(B) shows the results of an EMI test on a pressure sensor for which the present invention has been implemented, the test also using an electric field strength of 200 V/m.

FIG. 6 indicate that the present invention significantly reduces the magnitude of variations in the output of the sensor under a field emission having an electric field strength of 200 V/m. It is thus ascertained that the present invention dramatically improves resistance to extraneous noise.

In the illustrated embodiments, the semiconductor sensor chip has eight pads. One of the pads is used for the power supply and one for the ground, and two are the digital trimming pads 13 of a power supply pull-up type, while the remaining three are the digital trimming pads 14 of a power supply pull-down type. However, the present invention is not limited to these number of pads.

Further, the semiconductor sensor chips are shown to be of a semiconductor strain gauge type. However, the present invention is not limited to these chips; an electrostatic capacity or a cantilever type or other various semiconductor sensor chips may be used as well.

As described above, according to the present invention, the resistance to extraneous noise can be dramatically improved by significantly reducing the magnitude of variations in the output of the sensor under a field emission having, for example, an electric field strength of 200 V/m, to within 20 mV. Further, the present invention provides a relatively inexpensive, accurate, and reliable semiconductor physical quantity sensor.

What is claimed is:

1. A semiconductor physical quantity sensor that converts digital data into analog data for digital trimming in response to a signal from a sensor circuit indicating that an analog quantity has been detected, the semiconductor physical quantity sensor comprising:

digital input/output pads that have undergone digital trimming in order to obtain a predetermined output;

wherein pads that are pulled down to a ground inside a semiconductor chip and a ground pad are electrically connected to a ground terminal outside said semiconductor chip, and wherein pads that have been pulled up to a power supply inside a semiconductor chip and a power supply pad are electrically connected to a power supply terminal outside said semiconductor chip.

2. The semiconductor physical quantity sensor according to claim 1, wherein the connections between the pads that have been pulled down inside the semiconductor chip and the ground terminal as well as the connections between the pads that have been pulled up inside the semiconductor chip and the power supply terminal are each established by electrically connecting the terminals together on a package.

3. The semiconductor physical quantity sensor according to claim 1, wherein the connections between the pads that have been pulled down inside the semiconductor chip and the ground terminal as well as the connections between the pads that have been pulled up inside the semiconductor chip and the power supply terminal are each established by an electric connection on a mounting substrate.

4. The semiconductor physical quantity sensor according to any of claims 1 to 3, wherein as a layout on said semiconductor chip, of the digital input/output pads, the pads that have been pulled down inside said semiconductor chip are arranged closer to the ground pad, and the pads that have been pulled up inside said semiconductor chip are arranged closer to the power supply pad.

5. The semiconductor physical quantity sensor according to any of claims 1 to 3, wherein the semiconductor physical quantity sensor is a pressure or an acceleration sensor of the semiconductor strain gauge type.

6. A semiconductor physical quantity sensor comprising:
a semiconductor chip placed on at least on of a resin case and a substrate via a pedestal, and
wherein both first pads in said semiconductor chip which are to be pulled down and a ground pad are electrically connected to a ground outside said semiconductor chip.

7. The semiconductor physical quantity sensor according to claim 6, wherein characterized in that both second pads in said semiconductor chip which are to be pulled up and a power supply pad are electrically connected to a power supply outside said semiconductor chip.

8. A semiconductor physical quantity sensor comprising:
a semiconductor chip placed on at least one of a resin case and a substrate via a pedestal, and
wherein both second pads in said semiconductor chip which are to be pulled up and a power supply pad are electrically connected to a power supply outside said semiconductor chip.

9. A semiconductor physical quantity sensor comprising:
a semiconductor chip placed on a resin case via a pedestal, said resin case including lead frames that are insert-molded, and within said resin case are formed both a ground-connecting external wire through which a ground pad of said semiconductor chip and first pads to be pulled down are electrically connected, and an power-supply-connecting external wires through which a power supply pad of said semiconductor chip and second pads to be pulled up are electrically connected;
wherein said ground-connecting external wire is connected to a ground lead frame, whereas said power-supply-connecting external wire is connected to a power supply lead frame.

10. The semiconductor physical quantity sensor according to claim 9, wherein said ground-connecting external wire and said power-supply-connecting external wire are each connected to corresponding lead frames outside said resin case.

11. The semiconductor physical quantity sensor according to claim 9 or 10, wherein said ground-connecting external wire and said ground lead frame are integrated, and said power-supply-connecting external wire and said power supply lead frame are integrated.

12. A semiconductor physical quantity sensor comprising:
a conductor pattern for ground connections, a conductor pattern for power supply connections, and an output conductor pattern are formed on a substrate;
wherein lead frames corresponding to a ground pad of a semiconductor chip placed on a resin case and first pads thereof which are to be pulled down are connected to said conductor pattern for ground connections; and
wherein lead frames corresponding to a power supply pad of said semiconductor chip and second pads thereof which are to be pulled up are electrically connected to said conductor pattern for power supply connections, and
wherein output lead frame corresponding to an output pad of said semiconductor chip is electrically connected to the output conductor pattern.

13. The semiconductor physical quantity sensor according to claim 4, wherein the semiconductor physical quantity sensor is a pressure or an acceleration sensor of the semiconductor strain gauge type.

* * * * *